(12) United States Patent
Zhang et al.

(10) Patent No.: US 9,779,827 B2
(45) Date of Patent: Oct. 3, 2017

(54) VOLTAGE CONTROL CIRCUIT FOR MEMORY CELL AND THE METHOD THEREOF

(71) Applicant: Monolithic Power Systems Inc., San Jose, CA (US)

(72) Inventors: Tianzhu Zhang, Chengdu (CN); Da Chen, Chengdu (CN)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

(21) Appl. No.: 15/355,021

(22) Filed: Nov. 17, 2016

(65) Prior Publication Data

US 2017/0154684 A1    Jun. 1, 2017

(30) Foreign Application Priority Data

Nov. 26, 2015 (CN) .......................... 2015 1 0843819

(51) Int. Cl.
| | | |
|---|---|---|
| *G11C 16/30* | (2006.01) | |
| *G11C 16/04* | (2006.01) | |
| *G11C 16/10* | (2006.01) | |
| *G11C 16/14* | (2006.01) | |

(52) U.S. Cl.
CPC .......... *G11C 16/30* (2013.01); *G11C 16/0408* (2013.01); *G11C 16/10* (2013.01); *G11C 16/14* (2013.01)

(58) Field of Classification Search
CPC ......... G11C 16/30; G11C 16/14; G11C 16/10; G11C 16/0408
See application file for complete search history.

(56) References Cited

U.S. PATENT DOCUMENTS

| | | | | |
|---|---|---|---|---|
| 5,483,486 A | * | 1/1996 | Javanifard | G11C 5/143 327/536 |
| 5,602,794 A | * | 2/1997 | Javanifard | G11C 5/145 257/299 |
| 7,447,064 B1 | * | 11/2008 | Bu | G11C 16/0441 257/315 |
| 7,646,638 B1 | * | 1/2010 | Bu | G11C 16/0416 365/185.05 |
| 2005/0140426 A1 | * | 6/2005 | Fujiwara | H02M 3/07 327/536 |
| 2005/0180227 A1 | * | 8/2005 | Kitajima | G11C 5/145 365/189.09 |
| 2005/0195149 A1 | * | 9/2005 | Ito | H02M 3/07 345/98 |

(Continued)

*Primary Examiner* — Khamdan Alrobaie
(74) *Attorney, Agent, or Firm* — Perkins Coie LLP

(57) ABSTRACT

A voltage control circuit for a memory cell having a floating gate transistor and a capacitive device, comprising a first input terminal, a second input terminal, a first output terminal and a second input terminal, wherein the first input terminal is configured to receive a power supply voltage, the second input terminal is configured to receive a ground reference, and wherein based on the power supply voltage and the ground reference, the first output terminal and the second output terminal respectively provides a first voltage signal and a second voltage signal, and wherein a voltage value of the first voltage signal is twice the power supply voltage, and a maximum of a voltage difference between the first voltage signal and the second voltage signal is three times the power supply voltage.

13 Claims, 4 Drawing Sheets

(56) References Cited

U.S. PATENT DOCUMENTS

2008/0218250 A1* 9/2008 Kimura .................. H02M 3/07
327/536
2017/0025548 A1* 1/2017 Yamazaki ......... H01L 29/78696

* cited by examiner

VOLTAGE CONTROL CIRCUIT FOR MEMORY CELL AND THE METHOD THEREOF

CROSS-REFERENCE TO RELATED APPLICATIONS

This application claims priority to and the benefit of Chinese Patent Application No. 201510843819.9, filed on Nov. 26, 2015, which is incorporated herein by reference in its entirety.

FIELD

The present invention relates generally to electronic circuits, and more particularly but not exclusively to voltage control circuit and the method thereof.

BACKGROUND

Floating gate transistor is widely adopted in NVM devices like Flash, EPROM (Electrically Programmable Read-Only-Memory) and EEPROM (Electrically Erasable Programmable Read-Only Memory) because of its capability to store charges after power down. When a floating gate transistor is adopted in a memory cell, different voltages are needed during different operations. For example, two voltages are needed during erase operation, and the voltage difference between the two voltages may reach three times the power supply voltage. In a prior art voltage control circuit for providing voltages to the floating gate transistor, the highest voltage which is three times the power supply voltage together with a ground reference are provided during the erase operation. As a result, a high voltage circuit process is required to implement the voltage control circuit, which highly increases the cost.

Therefore, there is a need to provide a voltage control circuit implemented with low voltage circuit process to provide required voltages during different operations to the floating gate transistor.

SUMMARY

It is an object of the present invention to provide a voltage control circuit providing two voltage signals with a voltage difference three times the power supply voltage between each other. The voltage control circuit could be implemented with low voltage circuit process so as to improve the circuit compatibility and to save cost.

In accomplishing the above and other objects, there has been provided, in accordance with an embodiment of the present invention, a voltage control circuit for a memory cell having a floating gate transistor and a capacitive device, comprising a first input terminal, a second input terminal, a first output terminal and a second input terminal, wherein the first input terminal is configured to receive a power supply voltage, the second input terminal is configured to receive a ground reference, and wherein based on the power supply voltage and the ground reference, the first output terminal and the second output terminal respectively provides a first voltage signal and a second voltage signal, and wherein a voltage value of the first voltage signal is twice the power supply voltage, and a maximum of a voltage difference between the first voltage signal and the second voltage signal is three times the power supply voltage.

In accomplishing the above and other objects, there has been provided, in accordance with an embodiment of the present invention, a memory cell comprising: a first floating gate transistor having a source terminal, a drain terminal and a gate terminal; a capacitive device having a first terminal and a second terminal, wherein the first terminal is coupled to the gate terminal of the first floating gate transistor, and the second terminal is configured as a control terminal of the memory cell; and a voltage control circuit having a first input terminal, a second input terminal, a first output terminal and a second output terminal, wherein the first input terminal is configured to receive a power supply voltage, the second input terminal is configured to receive a ground reference, and wherein based on the power supply voltage and the ground reference, the first output terminal and the second output terminal respectively provides a first voltage signal and a second voltage signal, and wherein a voltage value of the first voltage signal is twice the power supply voltage, and a maximum of a voltage difference between the first voltage signal and the second voltage signal is three times the power supply voltage; wherein during an erase operation and a write operation to the memory cell, the second voltage signal is applied to the control terminal of the memory cell.

In some embodiments, wherein during an erase operation to the memory cell, the first voltage signal is applied to the source terminal and the drain terminal of the first floating gate transistor, and wherein during a write operation to the memory cell, the power supply voltage is applied to the source terminal of the first floating gate transistor, and the ground reference is applied to the drain terminal of the first floating gate transistor.

In some embodiments, the voltage control circuit comprises: a first voltage converting circuit configured to provide the first voltage signal; and a second voltage converting circuit configured to provide the second voltage signal, wherein the second voltage converting circuit comprises: an output terminal configured to provide the second voltage signal; a slope signal generator having a first input terminal, a second input terminal, a third input terminal and an output terminal, wherein the first input terminal is configured to receive the power supply voltage, the second input terminal is configured to receive the ground reference, the third input terminal is configured to receive an operation indicative signal, and wherein based on the power supply voltage, the ground reference and the operation indicative signal, the output terminal provides a slope signal, and wherein from a beginning of each write operation or from a beginning of each erase operation to the memory cell, the slope signal rises from a voltage value of the ground reference to a voltage value of the power supply voltage, and maintains the voltage value of the power supply voltage afterwards; and a negative charge pump having a first input terminal, a second input terminal and an output terminal, wherein the first input terminal is coupled to the slope signal generator to receive the slope signal, the second input terminal is configured to receive the ground reference, and the output terminal is configured to provide a mirrored slope signal based on the slope signal and the ground reference; wherein when the operation indicative signal indicates the write operation to the memory cell, the slope signal is selected to be the second voltage signal and is provided to the floating gate transistor; and when the operation indicative signal indicates the erase operation to the memory cell, the mirrored slope signal is selected to be the second voltage signal and is provided to the floating gate transistor.

In accomplishing the above and other objects, there has been provided, in accordance with an embodiment of the present invention, a voltage control method of a memory cell, wherein the memory cell comprises a floating gate transistor and a capacitive device, comprising: generating a first voltage signal having a voltage value twice a power supply voltage by a positive charge pump; generating a slope signal having a voltage value rising from a voltage value of a ground reference to the voltage value of the power supply voltage from a beginning of each write operation or from a beginning of each erase operation of the memory cell, and maintaining the voltage value of the power supply voltage afterwards; converting the slope signal to a second voltage signal by a negative charge pump; and providing the first voltage signal and the second voltage signal to the memory cell during the erase operation of the memory cell.

The use of the same reference label in different drawings indicates the same or like components.

DETAILED DESCRIPTION

In the present invention, numerous specific details are provided, such as examples of circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
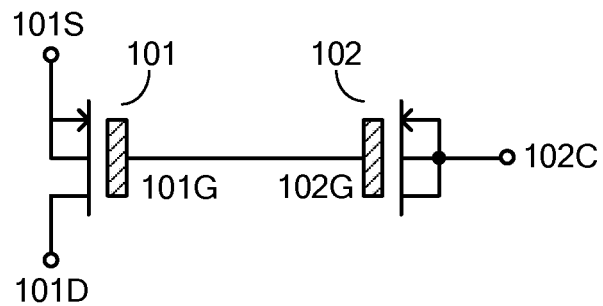
FIG. 1 schematically shows a memory cell 10 in accordance with an embodiment of the present invention.

FIG. 1 schematically shows a memory cell 10 in accordance with an embodiment of the present invention. As shown in FIG. 1, the memory cell 10 comprises a first floating gate transistor 101 and a second floating gate transistor 102. The first floating gate transistor 101 has a gate terminal 101G, a drain terminal 101D and a source terminal 101S. The second floating gate transistor 102 has a gate terminal 102G coupled to the gate terminal 101G of the first floating gate transistor 101, a source terminal and a drain terminal coupled together to be as a control terminal 102C of the memory cell 10.

As shown in FIG. 1 that the second floating gate transistor 102 is adopted as a capacitive device coupled to the gate terminal 101G of the first floating gate transistor 101. In some embodiments, other capacitive device, like a capacitor, may be adopted to replace the second floating gate transistor 102.

In one embodiment, the memory cell 10 is adopted in a non-volatile memory.

In one embodiment, the memory cell 10 is adopted in a multi-time programming device.

Figure 2:
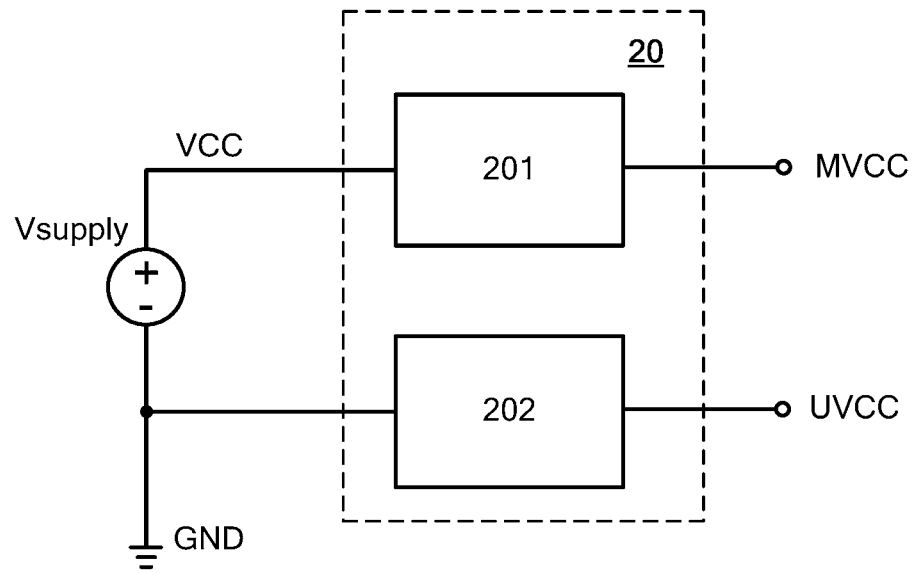
FIG. 2 schematically shows a voltage control circuit 20 in accordance with an embodiment of the present invention.

FIG. 2 schematically shows a voltage control circuit 20 in accordance with an embodiment of the present invention. As shown in FIG. 2, the voltage control circuit 20 has a first input terminal, a second input terminal, a first output terminal and a second output terminal, wherein the first input terminal is configured to receive a power supply voltage VCC, the second input terminal is configured to receive a ground reference GND, and wherein based on the power supply voltage VCC and the ground reference GND, the first output terminal and the second output terminal respectively provides a first voltage signal MVCC and a second voltage signal UVCC, and wherein a voltage value of the first voltage signal MVCC is twice the power supply voltage VCC, and a maximum of a voltage difference between the first voltage signal MVCC and the second voltage signal UVCC is three times the power supply voltage VCC.

In one embodiment, the power supply voltage VCC powers a whole system comprising the voltage control circuit 20 and the memory cell 10. In one embodiment, the power supply voltage VCC is provided by a voltage source Vsupply.

Figure 3:
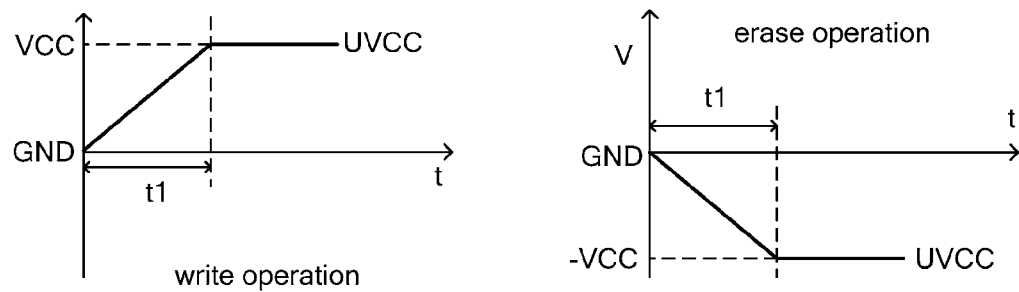
FIG. 3 shows waveforms of the second voltage signal UVCC during a write operation and an erase operation to the memory cell 10.

FIG. 3 shows waveforms of the second voltage signal UVCC during a write operation and an erase operation to the memory cell 10. As can be seen from FIG. 3, during the write operation, the second voltage signal UVCC is a slope signal rises from a voltage value of the ground reference GND, and reaches a voltage value of the power supply voltage VCC after a time period t1. The second voltage signal UVCC maintains the voltage value of the power supply voltage VCC afterwards. During the erase operation, the second voltage signal UVCC is a slope signal decreases from the voltage value of the ground GND, and reaches a voltage value negative to the power supply voltage VCC after the time period t1.

In one embodiment, the time period t1 is in a range of 8 ms-12 ms.

In one embodiment, the power supply voltage VCC has a voltage value of 3.3V, and then the first voltage signal MVCC has a voltage value of 6.6V. In another embodiment, the power supply voltage VCC has a voltage value of 5V, and then the first voltage signal MVCC has a voltage value of 10V.

The voltage values of the power supply voltage VCC and the first voltage signal MVCC may vary in different applications.

In one embodiment, the voltage control circuit 20 comprises a first voltage converting circuit 201 and a second voltage converting circuit 202. The first voltage converting circuit 201 converts the power supply voltage VCC to the first voltage signal MVCC, and the second voltage converting circuit 202 converts the power supply voltage VCC to the second voltage signal UVCC.

In one embodiment, the first voltage converting circuit 201 comprises a positive charge pump.

Figure 4:
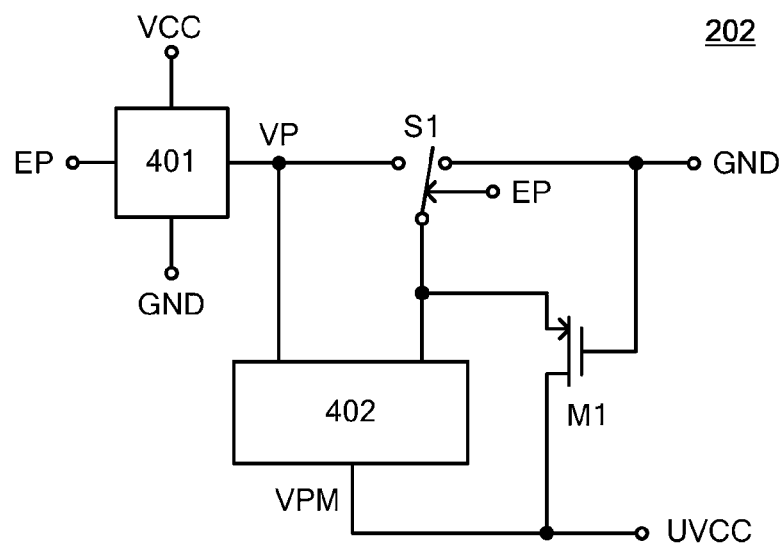
FIG. 4 schematically shows a second voltage converting circuit 202 in accordance with an embodiment of the present invention.

FIG. 4 schematically shows the second voltage converting circuit 202 in accordance with an embodiment of the present invention. As shown in FIG. 4, the second voltage converting circuit 202 comprises: an output terminal configured to provide the second voltage signal UVCC; a slope signal generator 401 having a first input terminal, a second input terminal, a third input terminal and an output terminal, wherein the first input terminal is configured to receive the power supply voltage VCC, the second input terminal is configured to receive the ground reference GND, the third input terminal is configured to receive an operation indicative signal EP, and wherein based on the power supply voltage VCC, the ground reference GND and the operation indicative signal EP, the output terminal provides a slope signal VP, and wherein from a beginning of each write operation or from a beginning of each erase operation to the memory cell 10, the slope signal rises from the voltage value of the ground reference GND to the voltage value of the power supply voltage VCC, and maintains the voltage value of the power supply voltage VCC afterwards; a selecting circuit S1 having a first input terminal coupled to the output terminal of the slope signal generator 401 to receive the slope signal VP, a second input terminal configured to receive the ground reference GND, a control terminal configured to receive the operation indicative signal EP, and an output terminal configured to provide one of the slope signal VP and the ground reference GND based on the operation indicative signal EP; a negative charge pump 402 having a first input terminal, a second input terminal and an output terminal, wherein the first input terminal is coupled to the slope signal generator 401 to receive the slope signal VP, the second input terminal is coupled to the output terminal of the selecting circuit S1, and the output terminal is configured to provide a mirrored slope signal VPM and is coupled to the output terminal of the second voltage converting circuit 202; and a switch M1 having a first terminal coupled to the output terminal of the selecting circuit S1, a second terminal coupled to the output terminal of the second voltage converting circuit 202, and a control terminal configured to receive the ground reference GND; wherein when the operation indicative signal EP indicates the write operation to the memory cell 10, the slope signal VP is selected to be the second voltage signal UVCC and is provided to the control terminal 102C of the memory cell 10; and when the operation indicative signal EP indicates the erase operation to the memory cell 10, the mirrored slope signal VPM is selected to be the second voltage signal UVCC and is provided to the control terminal 102C of the memory cell 10.

In one embodiment, the mirrored slope signal VPM is a negative signal to the slope signal VP. So during write operation, UVCC=VP, while during erase operation, UVCC=VPM=−VP.

In one embodiment, the second voltage converting circuit 202 further comprises a drive circuit. The drive circuit is coupled to the output terminal of the slope signal generator 401 to enhance the drivability of the slope signal VP (not shown in FIG. 4).

Any circuit generating a slope signal rising from the ground reference to the power supply voltage and having a rising time of 8 ms-12 ms could be adopted as the slope signal generator in FIG. 4. In one embodiment, the slope signal VP could be generated by charging a capacitor with a current source. In another embodiment, the slope signal VP could be generated by a clamp circuit combined with a capacitor charging circuit.

In the example of FIG. 4, the switch M1 comprises a PMOS (P-type Metal Oxide Semiconductor) device. The PMOS device has a source terminal coupled to the output terminal of the selecting circuit S1, a gate terminal configured to receive the ground reference GND, and a drain terminal coupled to the output terminal of the second voltage converting circuit 202. The PMOS device is turned on when the voltage at the source terminal is larger than the voltage at the gate terminal.

In the example of FIG. 4, the second voltage signal UVCC is applied to the control terminal 102C of the memory cell 10 during the erase operation and write operation. During the write operation, the switch S1 is controlled by the operation indicative signal EP to provide the slope signal VP at the output terminal. The slope signal VP is also provided to the first terminal (source terminal) of the switch M1. Since the slope signal VP at the first terminal (source terminal) has a higher voltage value than the ground reference GND at the control terminal (gate terminal), the switch M1 is turned on then. As a result, the output terminal of the selecting circuit S1 is connected to the output terminal of the second voltage converting circuit 202, which means that the negative charge pump 402 is bypassed, so that the slope signal VP is provided as the second voltage signal UVCC. During the erase operation, the selecting circuit S1 is controlled by the operation indicative signal EP to provide the ground reference GND at the output terminal. The ground reference GND is also provided to the first terminal (source terminal) of the switch M1. Since the control terminal (gate terminal) and the first terminal (source terminal) are both coupled to the ground reference GND, and the switch M1 is turned off then. As a result, the mirrored slope signal VPM is provided to the output terminal of the second voltage converting circuit 402 as the second voltage signal UVCC.

In the present invention, if a signal A is a mirrored signal to a signal B referring to a signal C, then A−C=−(B−C). In the above description, the mirrored signal VPM is a mirrored signal to the slope signal VP referring to the ground reference GND. In other words, if the ground reference GND has a voltage value 0 and the slope signal VP has a voltage value 3V, then the mirrored slope signal VPM has a voltage value −3V. If the ground reference GND has a voltage value 2V and the slope signal VP has a voltage value 5V, then the mirrored slope signal VPM has a voltage value −1V.

In one embodiment, the selecting circuit S1 and the switch M1 are omitted. In that case, the slope signal generator 401 provides the slope signal VP to the first input terminal of the negative charge pump 402, and the second input terminal of the negative charge pump 402 is coupled to the ground reference GND. The negative charge pump 402 provides the mirrored slope signal VPM to the output terminal of the second voltage converting circuit 202 as the second voltage signal UVCC based on the slope signal VP and the ground reference GND. And the second voltage signal UVCC is provided to the control terminal 102C only during the erase operation to the memory cell 10.

Persons of ordinary skills in the art should know that there are several operations to the memory cell 10, which are write operation, erase operation and read operation.

During the write operation, the source terminal 101S of the first floating gate transistor 101 receives the power supply voltage VCC, and drain terminal 101D receives the ground reference GND, and the control terminal 102C receives the second voltage signal UVCC. As aforementioned, the second voltage signal UVCC equals to the slope signal VP and rises from the ground reference GND to the power supply voltage VCC during the write operation.

During the erase operation, the source terminal 101S and the drain terminal 101D are coupled together to receive the first voltage signal MVCC, and the control terminal 102C receive the second voltage signal UVCC. The second voltage signal UVCC equals to the mirrored slope signal VP during erase operation.

During the read operation, the source terminal 101S and the control terminal 102C receive the power supply voltage VCC, while the drain terminal 101D receives a reading signal VSENSE. The reading signal VSENSE is provided by a control circuit in the system, or is provided by an outside device, and is not discussed here.

Because different voltages applied to the memory cell 10 during different operations, logical circuits configured to control the different operations may have different power supply or ground reference. Thus signal converting circuit for converting signals between different logical circuits is needed.

Figure 5:
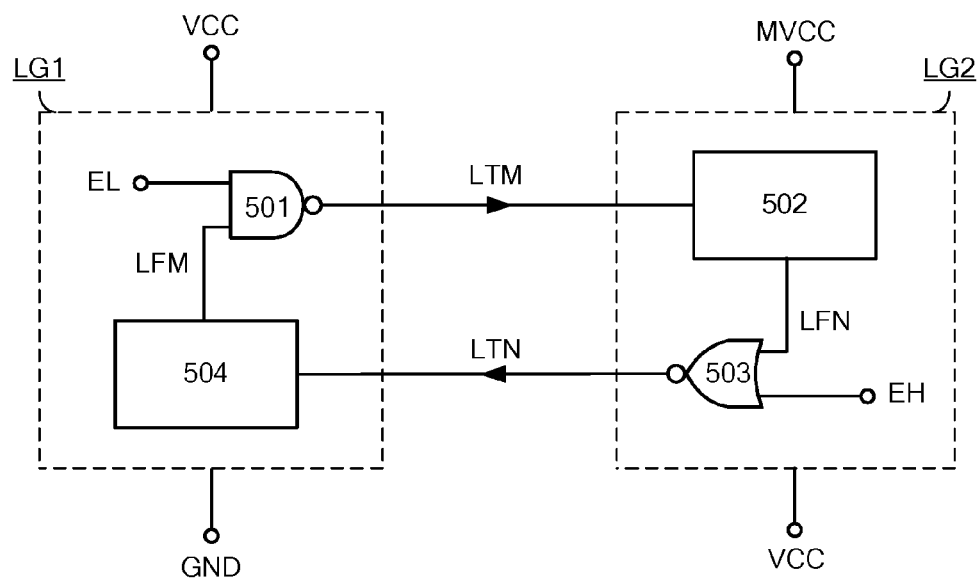
FIG. 5 schematically shows a signal converting circuit 50 in accordance with an embodiment of the present invention.

FIG. 5 schematically shows a signal converting circuit 50 in accordance with an embodiment of the present invention. The signal converting circuit 50 comprises: a first level circuit LG1 having a power terminal configured to receive the power supply voltage VCC, and a ground terminal configured to receive the ground reference GND; and a second level circuit LG2 having a power terminal configured to receive the first voltage signal MVCC, and a ground terminal configured to receive the power supply voltage VCC; wherein during the erase operation to the memory cell 10, the first level circuit LG1 converts a first logical signal LFM to a first converted logical signal LTM to provide to the second level circuit LG2, and the second level circuit LG2 converts a second logical signal LFN to a second converted logical signal LTN to provide to the first level circuit LG1, and wherein the first converted logical signal LTM and the second converted logical signal LTN have a voltage value of the power supply voltage VCC during the erase operation to the memory cell 10.

In one embodiment, the first level circuit LG1 comprises: a first logical circuit 504 having an output terminal configured to provide the first logical signal LFM; and an NAND gate circuit 501 having a first input terminal configured to receive a first indicating signal EL, a second input terminal configured to receive the first logical signal LFM, and an output terminal configured to provide the first converted logical signal LTM, wherein the first indicating signal EL is logical low during the erase operation.

In one embodiment, the second level circuit LG2 comprises a second logical circuit 502 configured to provide the second logical signal LFM; an NOR gate circuit 503 having a first input terminal configured to receive a second indicating signal EH, a second input terminal configured to receive the second logical signal LFN, and an output terminal configured to provide the second converted logical signal LTN, wherein the second indicating signal EH is logical high during the erase operation.

The second logical circuit 502 represents part of a logical control circuit configured to control the memory cell 10 during erase operation and the logical signal LFN represents any signal transmitted from the second logical circuit 502 to the first logical circuit 504. Because the highest voltage applied to the memory cell 10 is the first voltage signal MVCC which is twice the power supply voltage VCC, the second level circuit LG2 is powered by the first voltage signal MVCC and is grounded to the power supply voltage VCC. The first logical circuit 504 represents part of a logical control circuit configured to control the memory cell 10 during operations other than erase operation, and the first logical signal LFM represents any logical signal transmitted from the first logical circuit 504 to the second logical circuit 502. The first level circuit LG1 is powered by the power supply voltage VCC and is grounded to the ground reference GND. Since the logical circuit 504 and the second logical circuit 502 have different ground references, direct communications between the logical circuit 504 and the logical circuit 502 will cause errors and are not allowed.

Because both of the voltage differences between the power terminal and the ground terminal of the first level circuit LG1 and the second level circuit LG2 equal to the power supply voltage VCC, the first level circuit LG1 and the second level circuit LG2 could be implemented with low voltage circuit process which resulted in good compatibility.

In the example of FIG. 5, the first level circuit LG1 comprises the first logical circuit 504 and the NAND gate circuit 501. The NAND gate circuit 501 receives the first indicating signal EL and the first logical signal LFM, and outputs the first converted logical signal LTM to the second logical circuit 502. The first indicating signal EL is a logical low signal during erase operation, so the first converted logical signal LTM keeps logical high and has a same voltage value with the power supply voltage VCC, which means the first converted logical signal LTM received by the second logical circuit 502 has a same voltage value with the ground reference of the second level circuit LG2. In other words, the first logical signal LFM is converted to a logical low signal LTM provided to the second logical circuit 502 during the erase operation.

In the example of FIG. 5, the second level circuit LG2 comprises the second logical circuit 502 and the NOR gate circuit 503. The NOR gate circuit 503 receives the second indicating signal EH and the second logical signal LFN, and outputs the second converted logical signal LTN to the first logical circuit 504. The second indicating signal EH is a logical low signal during erase operation, so the second converted logical signal LTN keeps logical low and has the same voltage value with the power supply voltage VCC, which means the second converted logical signal LTN received by the first logical circuit 504 has a same voltage value with the power supply voltage VCC of the first level circuit LG1. In other words, the second logical signal LFN is converted to a logical high signal LTN provided to the first logical circuit 504 during the erase operation.

The voltage control circuit 20 provided by the present invention provides a first voltage signal MVCC twice the power supply voltage VCC, and a second voltage signal UVCC which is negative to the power supply voltage VCC. So that when the first voltage signal MVCC and the second voltage signal UVCC are provided to the memory cell 10 during the erase operation, there could be a voltage difference which is three times the power supply voltage VCC between the source terminal 101S of the first floating gate transistor 101 and the control terminal 102C, to perform the erase operation to the memory cell 10. The first voltage converting circuit providing the first voltage signal MVCC and the second voltage converting circuit providing the second voltage signal UVCC could be implemented with low-voltage circuit process. So the process compatibility is improved and the cost is saved. Furthermore, the present invention provides the signal converting circuit 50 to convert signals between the level circuits with different power supply voltage and difference ground reference.

Figure 6:
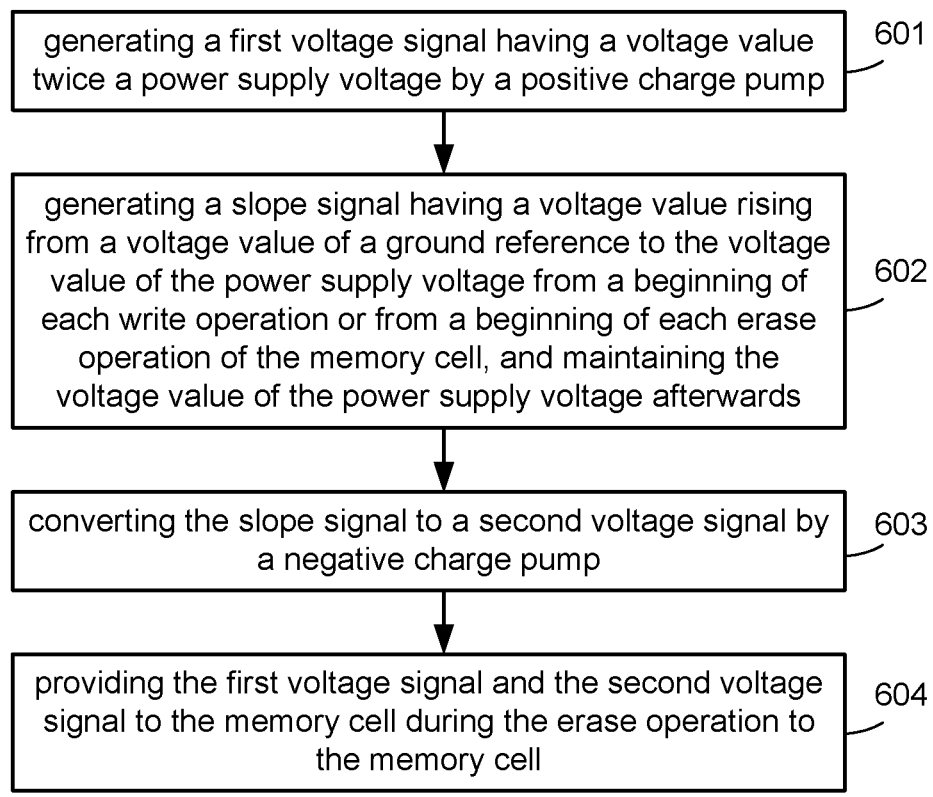
FIG. 6 shows a flow chart of a voltage control method 60 for providing voltage signals to the memory cell 10 in FIG. 1.

FIG. 6 shows a flow chart of a voltage control method 60 for providing voltage signals to the memory cell 10 in FIG. 1. The voltage control method 60 comprises: step 601, generating a first voltage signal having a voltage value twice a power supply voltage by a positive charge pump; step 602, generating a slope signal having a voltage value rising from a voltage value of a ground reference to the voltage value of the power supply voltage from a beginning of each write operation or from a beginning of each erase operation of the memory cell, and maintaining the voltage value of the power supply voltage afterwards; step 603, converting the slope signal to a second voltage signal by a negative charge pump; and step 604, providing the first voltage signal and the second voltage signal to the memory cell during the erase operation to the memory cell.

In one embodiment, the voltage control method 60 further comprises: step 605, providing the power supply voltage to a power terminal of a first level circuit, and providing the ground reference to a ground terminal of the first level circuit, wherein the first level circuit controls the write operation or a read operation to the memory cell; and step 606, providing the first voltage signal to a power terminal of a second level circuit, and providing the power supply voltage to a ground terminal of the second level circuit, wherein the second level circuit controls the erase operation to the memory cell; wherein during the erase operation: a first logical signal provided by the first level circuit to the second level circuit is converted to a first converted logical signal having a same voltage value with the power supply voltage; and a second logical signal provided by the second level circuit to the first level circuit is converted to a second converted logical signal having a same voltage value with the power supply voltage.

In one embodiment, a rising time period of the slope signal is in a range of 8 ms-12 ms.

In one embodiment, the power supply voltage has a voltage value of 3.3V, and the first voltage signal has a voltage value of 6.6V. In one embodiment, the power supply voltage has a voltage value of 5V, and the first voltage signal has a voltage value of 10V.

The present invention provides a voltage control circuit with simple structure to control the operation of the memory cell. The presented voltage control circuit provides a first voltage signal having a voltage value twice the power supply voltage and provides a second voltage signal having a voltage value negative to the power supply voltage, so as to establish a voltage difference three times the power supply voltage to perform the erase operation to the memory cell. The presented voltage control circuit could be implemented with low voltage circuit process, which highly saves the cost.

Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

What is claimed is:

1. A voltage control circuit for a memory cell having a floating gate transistor and a capacitive device, comprising:
a first input terminal, a second input terminal, a first output terminal and a second output terminal, wherein the first input terminal is configured to receive a power supply voltage, the second input terminal is configured to receive a ground reference, and wherein based on the power supply voltage and the ground reference, the first output terminal and the second output terminal respectively provides a first voltage signal and a second voltage signal, and wherein a voltage value of the first voltage signal is twice the power supply voltage, and a maximum of a voltage difference between the first voltage signal and the second voltage signal is three times the power supply voltage;
a first voltage converting circuit configured to provide the first voltage signal; and
a second voltage converting circuit configured to provide the second voltage signal, wherein the second voltage converting circuit comprises:
an output terminal configured to provide the second voltage signal;
a slope signal generator having a first input terminal, a second input terminal, a third input terminal and an output terminal, wherein the first input terminal is configured to receive the power supply voltage, the second input terminal is configured to receive the ground reference, the third input terminal is configured to receive an operation indicative signal, and wherein based on the power supply voltage, the ground reference and the operation indicative signal, the output terminal provides a slope signal, and wherein from a beginning of each write operation or from a beginning of each erase operation to the memory cell, the slope signal rises from a voltage value of the ground reference to a voltage value of the power supply voltage, and maintains the voltage value of the power supply voltage afterwards; and
a negative charge pump having a first input terminal, a second input terminal and an output terminal, wherein the first input terminal is coupled to the slope signal generator to receive the slope signal, the second input terminal is configured to receive the ground reference, and the output terminal is configured to provide a mirrored slope signal based on the slope signal and the ground reference; wherein
when the operation indicative signal indicates the write operation to the memory cell, the slope signal is selected to be the second voltage signal and is provided to the floating gate transistor; and
when the operation indicative signal indicates the erase operation to the memory cell, the mirrored slope signal is selected to be the second voltage signal and is provided to the floating gate transistor.

2. The voltage control circuit of claim 1, wherein the second voltage converting circuit further comprises:
a selecting circuit coupled between negative charge pump and the ground reference, wherein the selecting circuit has a first input terminal coupled to the output terminal of the slope signal generator to receive the slope signal, a second input terminal configured to receive the ground reference, a control terminal configured to receive the operation indicative signal, and an output terminal configured to provide one of the slope signal and the ground reference based on the operation indicative signal; and
a switch having a first terminal coupled to the output terminal of the selecting circuit, a second terminal coupled to the output terminal of the second voltage converting circuit, and a control terminal configured to receive the ground reference; wherein
during the write operation to the memory cell, the slope signal is selected to be provided at the output terminal of the selecting circuit, and the switch is turned on to connect the output terminal of the second voltage converting circuit to the output terminal of the selecting circuit, so that the slope signal is provided at the output terminal of the second voltage converting circuit as the second voltage signal; and
during the erase operation to the memory cell, the ground reference is selected to be provided to the negative charge pump, and the switch is turned off, so that the mirrored slope signal is provided at the output terminal of the second voltage converting circuit as the second voltage signal.

3. The voltage control circuit of claim 1, wherein a rising time period of the slope signal is in a range of 8 ms to 10 ms.

4. A memory cell comprising:
a first floating gate transistor having a source terminal, a drain terminal and a gate terminal;
a capacitive device having a first terminal and a second terminal, wherein the first terminal is coupled to the gate terminal of the first floating gate transistor, and the second terminal is configured as a control terminal of the memory cell; and
a voltage control circuit having a first input terminal, a second input terminal, a first output terminal and a second output terminal, wherein the first input terminal is configured to receive a power supply voltage, the second input terminal is configured to receive a ground reference, and wherein based on the power supply voltage and the ground reference, the first output terminal and the second output terminal respectively provides a first voltage signal and a second voltage signal, and wherein a voltage value of the first voltage signal is twice the power supply voltage, and a maximum of a voltage difference between the first voltage signal and the second voltage signal is three times the power supply voltage; wherein
the voltage control circuit comprises:
a first voltage converting circuit configured to provide the first voltage signal; and
a second voltage converting circuit configured to provide the second voltage signal, wherein the second voltage converting circuit comprises:
an output terminal configured to provide the second voltage signal;
a slope signal generator having a first input terminal, a second input terminal, a third input terminal and an output terminal, wherein the first input terminal is configured to receive the power supply voltage, the second input terminal is configured to receive the ground reference, the third input terminal is configured to receive an operation indicative signal, and wherein based on the power supply voltage, the ground reference and the operation indicative signal, the output terminal provides a slope signal, and wherein from a beginning of each write operation or from a beginning of each erase operation to the memory cell, the slope signal rises from a voltage value of the ground reference to a voltage value of the power supply voltage, and maintains the voltage value of the power supply voltage afterwards; and
a negative charge pump having a first input terminal, a second input terminal and an output terminal, wherein the first input terminal is coupled to the slope signal generator to receive the slope signal, the second input terminal is configured to receive the ground reference, and the output terminal is configured to provide a mirrored slope signal based on the slope signal and the ground reference; wherein
when the operation indicative signal indicates the write operation to the memory cell, the slope signal is selected to be the second voltage signal and is provided to the control terminal of the memory cell; and
when the operation indicative signal indicates the erase operation to the memory cell, the mirrored slope signal is selected to be the second voltage signal and is provided to the control terminal of the memory cell.

5. The memory cell of claim 4, wherein the capacitive device comprises a second floating gate transistor having a source terminal, a drain terminal and a gate terminal, wherein the source terminal and the drain terminal are coupled together to be the control terminal of the memory cell, and the gate terminal is coupled to the gate terminal of the first floating gate transistor.

6. The memory cell of claim 4, wherein during an erase operation to the memory cell, the first voltage signal is applied to the source terminal and the drain terminal of the first floating gate transistor, and wherein during a write operation to the memory cell, the power supply voltage is applied to the source terminal of the first floating gate transistor, and the ground reference is applied to the drain terminal of the first floating gate transistor.

7. The memory cell of claim 4, wherein the second voltage converting circuit further comprises:
a selecting circuit coupled between negative charge pump and the ground reference, wherein the selecting circuit has a first input terminal coupled to the output terminal of the slope signal generator to receive the slope signal, a second input terminal configured to receive the ground reference, a control terminal configured to receive the operation indicative signal, and an output terminal configured to provide one of the slope signal and the ground reference based on the operation indicative signal; and
a switch having a first terminal coupled to the output terminal of the selecting circuit, a second terminal coupled to the output terminal of the second voltage converting circuit, and a control terminal configured to receive the ground reference; wherein
during the write operation to the memory cell, the slope signal is selected to be provided at the output terminal of the selecting circuit, and the switch is turned on to connect the output terminal of the second voltage converting circuit to the output terminal of the selecting circuit, so that the slope signal is provided at the output terminal of the second voltage converting circuit as the second voltage signal; and
during the erase operation to the memory cell, the ground reference is selected to be provided to the negative charge pump, and the switch is turned off, so that the mirrored slope signal is provided at the output terminal of the second voltage converting circuit as the second voltage signal.

8. The memory cell of claim 4, wherein a rising time period of the slope signal is in a range of 8 ms to 10 ms.

9. The memory cell of claim 4, further comprising:
a first level circuit having a power terminal configured to receive the power supply voltage, and a ground terminal configured to receive the ground reference; and
a second level circuit having a power terminal configured to receive the first voltage signal, and a ground terminal configured to receive the power supply voltage; wherein
during the erase operation to the memory cell, the first level circuit converts a first logical signal to a first converted logical signal to provide to the second level circuit, and the second level circuit converts a second logical signal to a second converted logical signal to provide to the first level circuit, and wherein the first converted logical signal and the second converted logical signal have a voltage value of the power supply voltage during the erase operation.

10. The memory cell of claim 9, wherein the first level circuit comprises an NAND gate circuit having a first input terminal configured to receive a first indicating signal, a second input terminal configured to receive the first logical signal, and an output terminal configured to provide the first converted logical signal, wherein the first indicating signal is logical high during the erase operation.

11. The memory cell of claim 9, wherein the second level circuit comprises an NOR gate circuit having a first input terminal configured to receive a second indicating signal, a second input terminal configured to receive the second logical signal, and an output terminal configured to provide the second converted logical signal, wherein the second indicating signal is logical low during the erase operation.

12. A voltage control method of a memory cell, wherein the memory cell comprises a floating gate transistor and a capacitive device, comprising:
  generating a first voltage signal having a voltage value twice a power supply voltage by a positive charge pump;
  generating a slope signal having a voltage value rising from a voltage value of a ground reference to a voltage value of the power supply voltage from a beginning of each write operation or from a beginning of each erase operation of the memory cell, and maintaining the voltage value of the power supply voltage afterwards;
  converting the slope signal to a second voltage signal by a negative charge pump; and
  providing the first voltage signal and the second voltage signal to the memory cell during the erase operation of the memory cell.

13. The voltage control method of claim 12, further comprising:
  providing the power supply voltage to a power terminal of a first level circuit, and providing the ground reference to a ground terminal of the first level circuit, wherein the first level circuit controls the write operation or a read operation to the memory cell; and
  providing the first voltage signal to a power terminal of a second level circuit, and providing the power supply voltage to a ground terminal of the second level circuit, wherein the second level circuit controls the erase operation to the memory cell;
  wherein during the erase operation:
    a first logical signal provided by the first level circuit to the second level circuit is converted to a first converted logical signal having a same voltage value with the power supply voltage; and
    a second logical signal provided by the second level circuit to the first level circuit is converted to a second converted logical signal having a same voltage value with the power supply voltage.

* * * * *